US010256382B2

(12) United States Patent
White et al.

(10) Patent No.: US 10,256,382 B2
(45) Date of Patent: Apr. 9, 2019

(54) COLLIMATED OLED LIGHT FIELD DISPLAY

(71) Applicant: Applied Materials, Inc., Santa Clara, CA (US)

(72) Inventors: John M. White, Hayward, CA (US); Christopher Dennis Bencher, Cupertino, CA (US); Manivannan Thothadri, Mountain View, CA (US); Robert Jan Visser, Menlo, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/837,654

(22) Filed: Dec. 11, 2017

(65) Prior Publication Data

US 2018/0166616 A1 Jun. 14, 2018

Related U.S. Application Data

(60) Provisional application No. 62/432,156, filed on Dec. 9, 2016.

(51) Int. Cl.
| | |
|---|---|
| *H01L 33/58* | (2010.01) |
| *H01L 33/00* | (2010.01) |
| *H01L 25/065* | (2006.01) |
| *H01L 27/15* | (2006.01) |
| *G02B 27/22* | (2018.01) |

(Continued)

(52) U.S. Cl.
CPC ............ *H01L 33/58* (2013.01); *G02B 17/002* (2013.01); *G02B 27/2214* (2013.01);
(Continued)

(58) Field of Classification Search
CPC ... H01L 33/58; H01L 25/0655; H01L 27/156; H04N 13/307; G02B 17/002; G02B 19/0028; G02B 19/0061; G02B 3/0056; G02B 5/045; G02B 27/2214
USPC ............ 257/88, 89, 98, 99, 80, 81, E33.058, 257/E33.059, E33.062, E33.072, E21.006, 257/E21.007, E21.053, E21.077, E21.127; 345/82, 419; 362/231, 240, 574; 438/141, 311, 597, 780
See application file for complete search history.

(56) References Cited

U.S. PATENT DOCUMENTS

| | | | |
|---|---|---|---|
| 8,362,695 B2 * | 1/2013 | Aanegola | ............ H01L 25/0753 313/506 |
| 9,559,250 B2 | 1/2017 | Bonar et al. | |

(Continued)

FOREIGN PATENT DOCUMENTS

| | | |
|---|---|---|
| WO | 2012081569 A1 | 6/2012 |
| WO | 2017087033 A1 | 5/2017 |

OTHER PUBLICATIONS

Maaskant, Pleun P. et al., "High-Speed Substrate-Emitting Micro-Light-Emitting Diodes for Applications Requiring High Radiance", Applied Physics Express 6 (2013).

(Continued)

*Primary Examiner* — Dao H Nguyen
(74) *Attorney, Agent, or Firm* — Patterson + Sheridan LLP (57) ABSTRACT

The present disclosure generally relates to light field displays and methods of displaying images with light field arrays. In one example, the present disclosure relates to pixel arrangements for use in light field displays. Each pixel includes a plurality of LEDs, such as micro LEDs, positioned adjacent respective micro-lenses of each pixel.

19 Claims, 9 Drawing Sheets

(51) Int. Cl.
*H04N 13/307* (2018.01)
*G02B 17/00* (2006.01)
*G02B 3/00* (2006.01)
*G02B 5/04* (2006.01)
*G02B 19/00* (2006.01)

(52) U.S. Cl.
CPC ........ *H01L 25/0655* (2013.01); *H01L 27/156* (2013.01); *H04N 13/307* (2018.05); *G02B 3/0056* (2013.01); *G02B 5/045* (2013.01); *G02B 19/0028* (2013.01); *G02B 19/0061* (2013.01); *H01L 2933/0058* (2013.01)

(56) References Cited

U.S. PATENT DOCUMENTS

| | | |
|---|---|---|
| 2006/0238545 A1 | 10/2006 | Bakin et al. |
| 2007/0217473 A1 | 9/2007 | Abe et al. |
| 2010/0203448 A1* | 8/2010 | Teshima .................. G03F 7/038 430/280.1 |
| 2013/0207964 A1 | 8/2013 | Fleck et al. |
| 2014/0300709 A1 | 10/2014 | Futterer et al. |
| 2015/0070476 A1 | 3/2015 | Wei |
| 2015/0070657 A1 | 3/2015 | Said |
| 2015/0288935 A1* | 10/2015 | Shinozaki ............ H04N 5/2176 348/322 |
| 2016/0076731 A1 | 3/2016 | Monch et al. |
| 2017/0038028 A1* | 2/2017 | Cho .................... H01L 25/0753 |
| 2017/0054060 A1* | 2/2017 | Hashiya ................ H01L 33/505 |

OTHER PUBLICATIONS

Bill Henry, "A Multi-pixel LED Print-Head for Novel Imaging Applications", InfiniLED (2012).

PCT International Search Report and Written Opinion dated Mar. 28, 2018, for International Application No. PCT/US2017/065563.

* cited by examiner

FIG. 6B ated OLED LIGHT FIELD
COLLIMATED OLED LIGHT FIELD DISPLAY

CROSS-REFERENCE TO RELATED APPLICATIONS

This application claims benefit of U.S. Provisional Patent Application Ser. No. 62/432,156, filed Dec. 9, 2016, which is herein incorporated by reference.

BACKGROUND

Field

Embodiments of the present disclosure generally relate to a light field displays and methods of displaying images with a light field array.

Description of the Related Art

Figure 1:
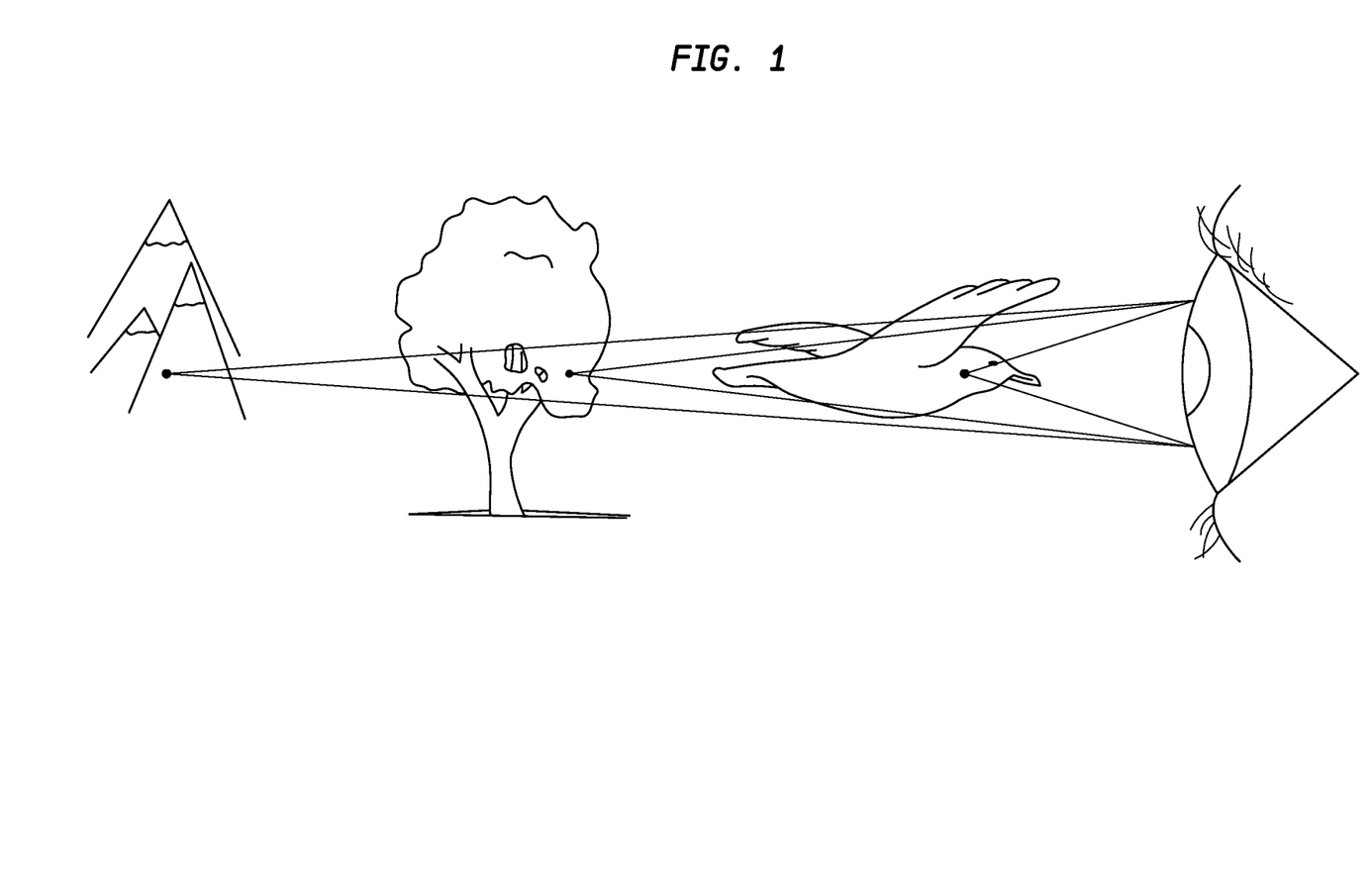
FIG. 1 illustrates angular light information from the perspective of a viewer.

Long held beliefs that our three dimensional (3D) perception of the world around us is primarily related to stereoscopic vision (where the convergence and/or divergence of two dimensional images viewed separately by the left and right eye combine in the brain to give the perception of depth) have largely been proven untrue. We now know that, in addition to convergence/divergence, visual cues from head and eye movements substantially influence a person's ability to perceive the world about them in three dimensions. For example, if the viewer in FIG. 1 moves her head from side to side she will perceive a relative motion between the bird and the mountain that is more than the relative motion she perceives between the bird and the tree, thereby indicating the mountain is the furthest away, which is generally known as motion parallax. Similarly, if she focuses her eye on the bird, the mountain will appear to be more blurry than the tree, another indication of the relative distances of the tree and the mountain compared to the bird, which is generally known as blur cue interpretation. Both motion parallax and blur cue interpretation, as well as other visual cues, require angular information which includes both the intensity of light rays reflected off a surface of an object and the angle of those light rays with respect to a focal plane of the viewer as the light rays travel from the object to the viewer. Light rays of different angles, with respect to a focal plane of the viewer, reflected off the same surface of an object will have different intensities. Advances in the area of light field technology have provided light field cameras capable of capturing tremendous amounts of angular information, however, current display technologies are unable to capture and use all of the angular information captured by a light field camera for the display of the image without user input.

Accordingly, what is needed in the art are high angular resolution light field displays.

SUMMARY

In one example, a pixel comprises a plurality of micro-lenses; and a plurality of collimated light emitting diodes (LEDs) positioned beneath each micro-lens, wherein LEDs under a respective micro-lens of the plurality of micro-lenses are configured to generate light of the same color.

In another example, a light-field display comprises a plurality of pixels, each pixel of the plurality of pixels comprising: a plurality of micro-lenses; and a plurality of collimated light emitting diodes (LEDs) positioned beneath each micro-lens, wherein LEDs under a respective micro-lens of the plurality of micro-lenses are configured to generate light of the same color.

In another example, a light-field display comprises a plurality of pixels, each pixel of the plurality of pixels comprising: a plurality of light-directing features formed on a substrate panel; and a plurality of collimated light emitting diodes (LEDs) positioned beneath respective light-directing features, the plurality of collimated LEDs arranged in linear strips according to a color of light generated thereby.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to light field displays and methods of displaying images with light field arrays. In one example, the present disclosure relates to pixel arrangements for use in light field displays. Each pixel includes a plurality of LEDs, such as micro LEDs, positioned adjacent respective micro-lenses of each pixel.

Figure 2A:
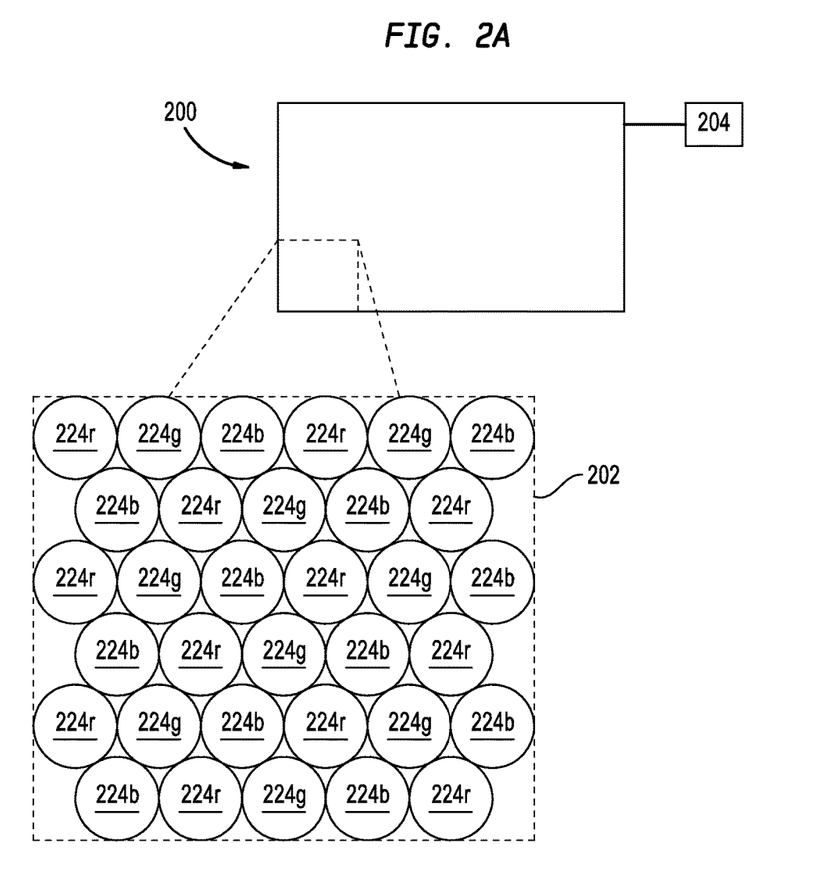
FIGS. 2A-2C schematically illustrate a pixel arrangement of a display according to one aspect of the disclosure.
Figure 2B:
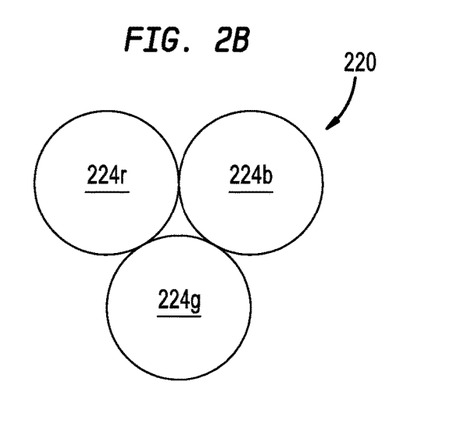
Figure 2C:
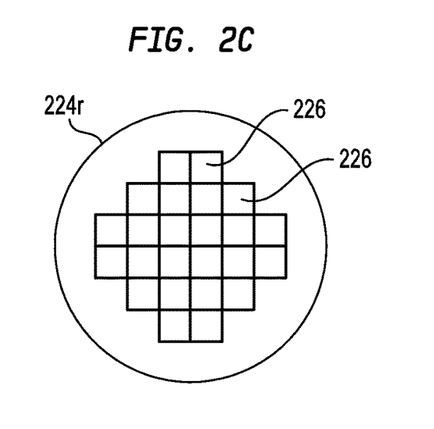

FIGS. 2A-2C schematically illustrate a pixel arrangement 202 of a light field display 200 according to one aspect of the disclosure. FIG. 2A illustrates an enlarged partial view of a pixel arrangement 202 having pixels 220 of a light field display 200. FIG. 2B schematically illustrates a plan view of a single pixel 220 of the pixel arrangement 202. FIG. 2C schematically illustrates a plan view of a micro-lens and collimated light emitting diodes (LEDs).

The light field display 200 is configured to produce a viewable image, and includes a plurality of pixels 220 controlled by a processor 204 to generate light, thus forming the viewable image. The plurality of pixels 220 is arranged in a pixel arrangement 202, such as a two dimensional hexagonal array or other planar configuration. Each pixel 220 includes a plurality of micro-lenses 224r, 224b, 224g, under which a plurality of plurality of collimated (LEDs), such as collimated micro-LEDs, 226 are positioned. In the example shown, the micro-lenses 224r, 224b, 224g of each pixel 220 are arranged in a triangular configuration with respect to one another, which facilitates a dense configuration of the pixels 220 in the light field display 200. The plurality of pixels 220 within the pixel arrangement 202 results in offset rows of micro-lenses (e.g., aligned in a horizontal direction but misaligned in a vertical direction, or vice versa) in the pixel arrangement 202. This dense configuration improves perceived resolution by a viewer.

Beneath each micro-lenses 224r, 224b, 224g is a plurality of collimated LEDs 226 (two are labeled in FIG. 2C) configured to emit light of a desired wavelength. While only micro-lens 224r is shown in FIG. 2C, it is to be understood that micro-lenses 224b and 224g are similarly configured. In one example, the LEDs 226 beneath the micro-lens 224r are configured to emit red light, the LEDs 226 beneath micro-lens 224b are configured to emit green light, and the LEDs 226 beneath micro-lens 224b are configured to emit blue light. Stated otherwise, each group of LEDs 226 under a respective micro-lens 224r, 224b, 224g, is monochromatic. Typically, red LEDs 206 generate light having a wavelength in the range between about 620 nm and about 780 nm, green LEDs 226 generate light having a wavelength in the range between about 495 nm and about 580 nm, and blue LEDs 203b generate light having wavelengths in the range between about 450 nm and about 495 nm.

For purposes of this disclosure, each group of three or more micro-lenses 224r, 224b, 224g, and the LEDs 226 associated therewith, constitute a pixel 220, configured to emit RGB light. Each micro-lens 224r, 224b, 224g may be tailored to collimate and/or transmit light of one color (or light within a specific wavelength range), corresponding to respective LEDs 226 disposed adjacent thereto. In one example, 24 LEDs 226 are positioned beneath each micro-lens 224r, 224b, 224g. In such an example, each pixel 220 is a single pixel of spatial resolution that has a plurality of angular (e.g., directional) resolutions. Specifically, each angular resolution corresponds to one of the LEDs 226 under a single micro-lens, and thus, the 24 LEDs 226 positioned beneath each micro-lens 224r, 224b, 224g each correspond to one of 24 angular resolutions. Thus, the number of pixels 220, and specifically the number of angular resolutions produced thereby, determine the effective resolution of the light field display 200.

In one example, the light field display 200 includes 1920×1080 pixels 220. Each pixel 220 includes micro-lenses 224r, 224b, 224g, each having 24 LEDs 226 corresponding thereto. Thus, each pixel 220 has an angular resolution of 24, generating an effective light field resolution of 46080×25920 for the light field display 200. It is contemplated that more or less than 24 LEDs 226 may be positioned beneath each micro-lens 224r, 224b, 224g, or that more or less than 1902×1080 pixels 220 may be utilized in the light field display 200.

The LEDs 226 are positioned in a "stepped diamond" configuration beneath each micro-lens 224r, 224b, 224g. The "stepped diamond" configuration maximizes the usable landscape under each micro-lens, further facilitating densification of the light field display 200 and thereby improving perceptible resolution. However, it is to be noted that other arrangements of the LEDs 226 are also contemplated, such as hexagonal, rectangular, "cross-shaped" or "plus sign". In one aspect, the configuration of LEDs 226 is selected to maximize the number of LEDs 226 under a respective micro-lens.

The micro-lenses 224r, 224b, 224g have a concave shape or surface for directing light from the LEDs 226 in a desired directions to provide a desired angular resolution. While the micro-lenses 224r, 224b, 224g are described as being concave, it is contemplated that other lens shapes, such as convex lenses, flat lenses (e.g., meta lenses), or Fresnel lenses, may be utilized. In one example, each LED 226 directs light upward, orthogonal to a plane of the pixel arrangement 202, e.g., orthogonal to a plane of the pixels 220 and a plane of the LEDs 226. The upward-directed light from each LED 226 is then directed in a predetermined direction by respective micro-lenses 224r, 224b, 224g, as described with respect to FIG. 2D.

Figure 2D:
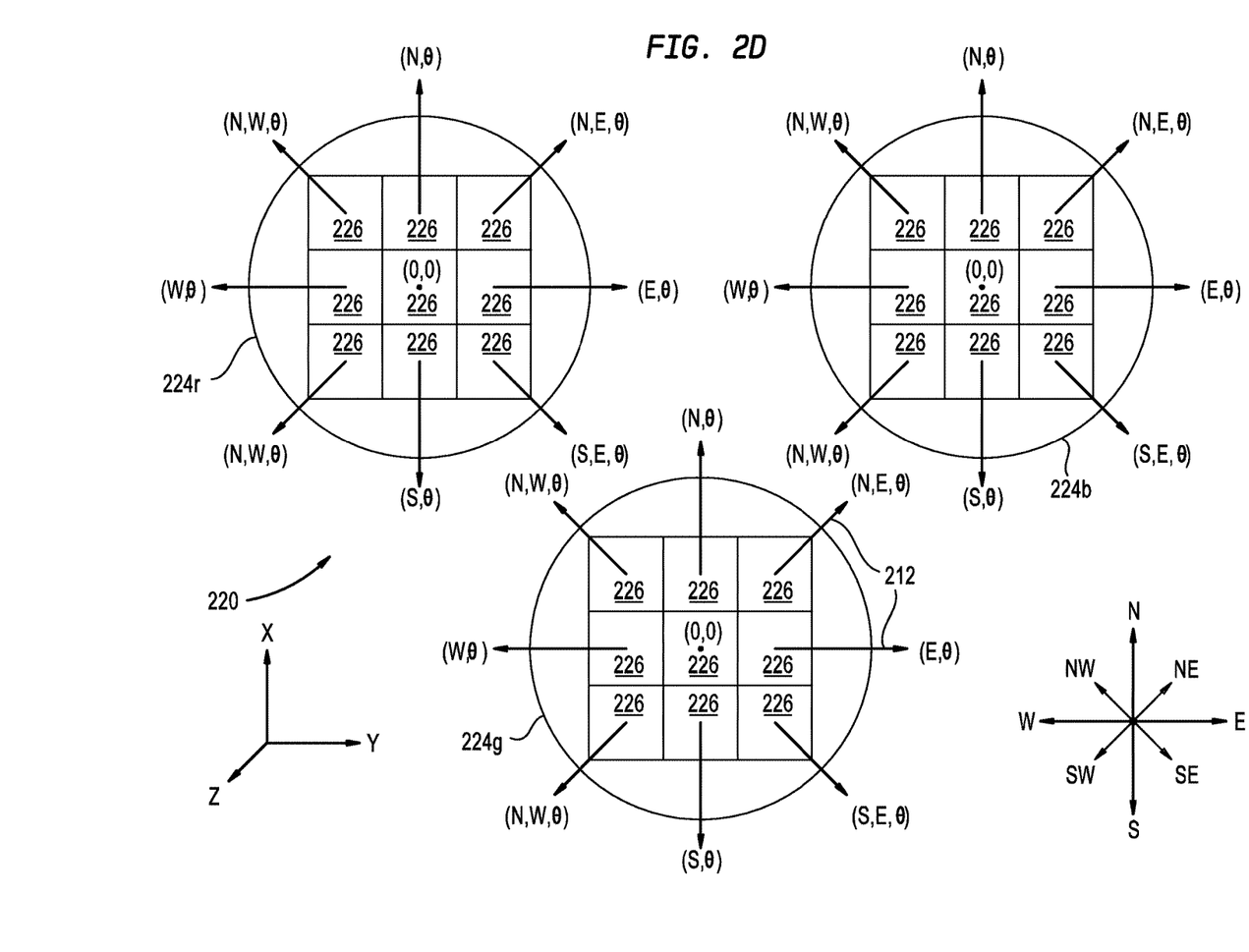
FIG. 2D schematically illustrates the directing of light rays from a pixel arrangement, according to one aspect of the disclosure.

FIG. 2D illustrates the directional components of light exiting micro-lenses 224r, 224b, 224g of a pixel 220. To facilitate explanation, only nine LEDs 226 are shown adjacent each micro-lens 224r, 224b, 224g (corresponding to an angular resolution of nine per pixel 220), however, it is to be appreciated that more or less than nine LEDs 226 may be utilized to generate a higher or lower angular resolution.

During operation, each LED 226 generates collimated light in a direction perpendicular to a surface of light field display 200, e.g., the z-axis. As the generated light passes through a respective micro-lens 224r, 224b, 224g, the light form each LED is directed in one of a plurality of predetermined directions, corresponding to angular resolutions of the pixel 220. The LEDs 226 of adjacent each micro-lens 224r, 224b, 224g are configured to direct light (indicated by 212, two are marked) in a direction measured with respect to the deviation, here angle θ, of the primary emission direction (the z-axis), and a directional component based on the North (N), east (E), south(S) and west (W) directions in the plane of the display surface 210. Thus, the primary light emission direction of each LED can be notated as (direction, angle θ) for explanation purposes, with the exception of a perpendicular (Z-direction) light ray, annotated as 0,0. Herein, the directional components N, S, E, and W respectively correspond to the upward, downward, rightward, and leftward directions of a display surface of the light field display 200.

In one example, the LEDs 226 disposed equidistant from a central LED 226 may each direct a light ray 212 which deviates from the Z direction by an angle θ (in a respective directional component). It is contemplated, however, that in some instances, angle θ may not be equal for each of the LEDs 226, depending on the desired angular resolution. Moreover, it is contemplated that additional LEDs 226 may be included, which direct light rays at an angle $\theta_1$, different than angle θ, in order to provide additional angular resolution. In such an example, the LEDs 226 having light directed at angle $\theta_1$ may be positioned radially outward of the LEDs 226 having light directed at angle θ. In such an example, angle $\theta_1$ is greater than angle θ. It is to be noted that additional LEDs 226 having light directed at angle $\theta_2$, angle $\theta_3$, and so forth, may be further included, to increase angular resolution. As noted above, each of the LEDs 226 generate light in a direction perpendicular to a display surface of the light field display 200, however, the particular angle θ (or angle $\theta_1$, angle $\theta_2$, etc.) is determined by the characteristics of a respective micro-lens 224r, 224b, 224g.

In a specific example of the above embodiment, a first LED 226 positioned centrally beneath a respective micro-lens 224r, 224b, 224g has light directed in the Z direction by a respective micro-lens 224r, 224b, 224g. A plurality of LEDs 226, spaced equidistant and radially outward from the first LED 226, have light directed by a respective micro-lens 224r, 224b, 224g at angle θ (in a corresponding compass direction). A second plurality of LEDs 226, disposed outward of the LEDs of the first plurality of LEDs 226 and equidistant from the first LED 226, have light directed by a respective micro-lens 224r, 224b, 224g at angle $\theta_1$ (in a corresponding compass direction). Additional LEDs 226, having lighted directed at additional angles $\theta_i$, may be further included to provide additional angular resolution.

Returning to FIG. 2D, to facilitate generation of an image, each LED 226 under the micro-lens 224r is operable with and corresponds to an LED 226 at a corresponding location under micro-lens 224b and micro-lens 224g. For example, the LED 226 under micro-lens 224r which directs a light ray 212 toward (NW, θ) corresponds to the LEDs 226 under micro-lens 224b and micro-lens 224g which also direct a light ray 212 toward (NW, θ), thereby resulting in RGB light rays 212 for a particular display angle of the angular resolution. Stated otherwise, each LED 226 under one of the micro-lens 224r, 224b, 224g, also has a corresponding LED 226 (of angular direction) under the remaining micro-lenses of the pixel 220, in order to direct RGB light to a particular angular location, facilitating display of an image.

While FIG. 2D is described with respect to compass directions, it is to be noted that such directions are only used to facilitate explanation, and that angular directions are not limited to intervals of 90 degrees or 45 degrees from one another.

Figure 3A:
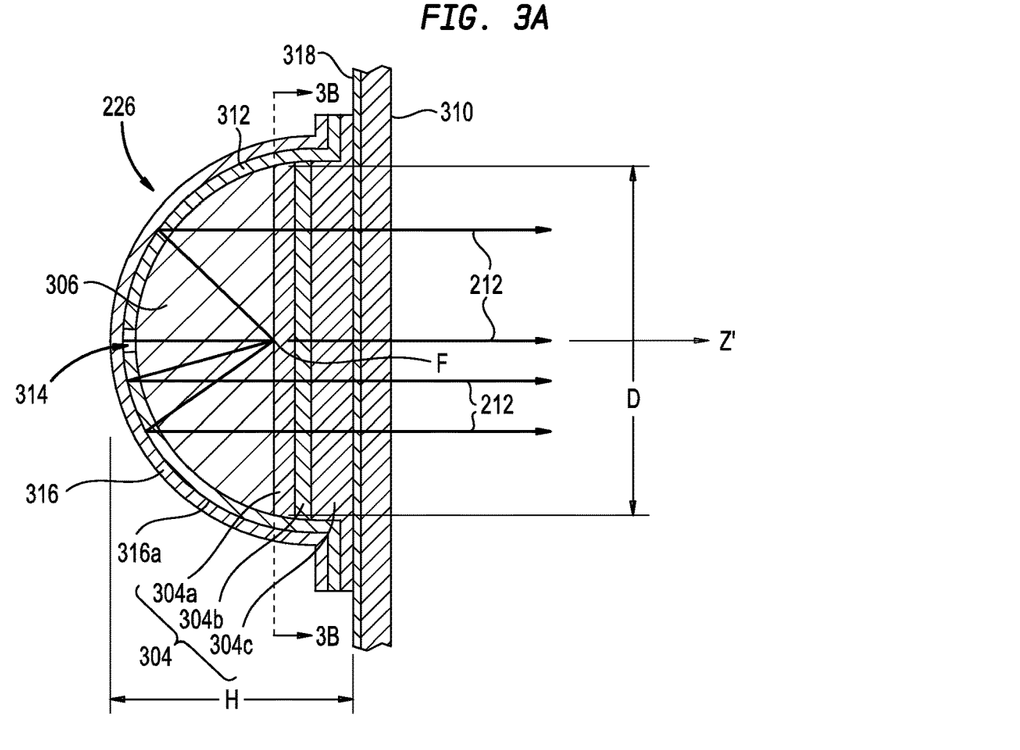
FIG. 3A is a schematic cross-sectional view of an LED, according to one embodiment.
Figure 3B:
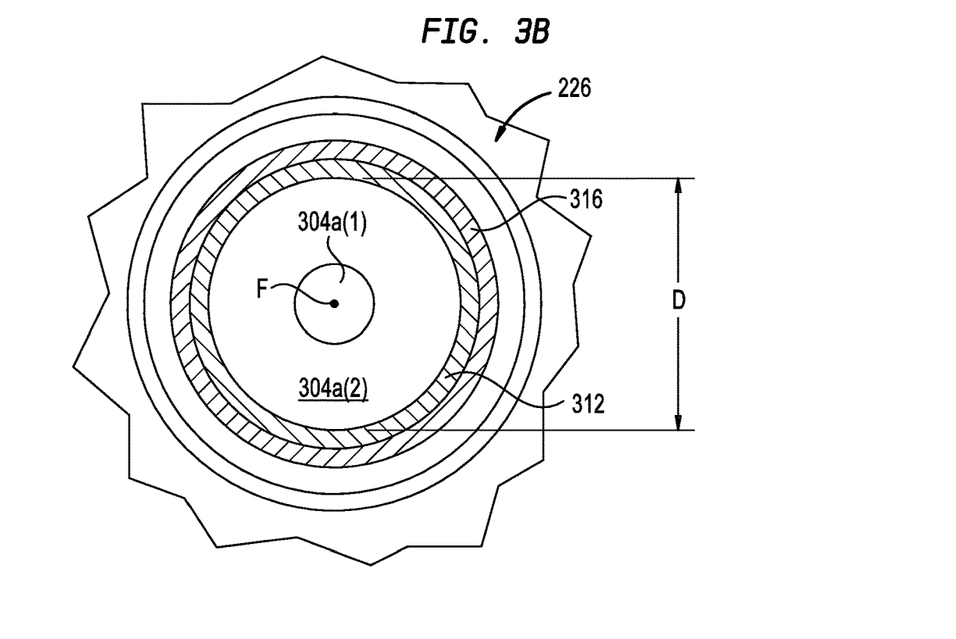
FIG. 3B is a sectional view of a portion of the LED described in FIG. 3A taken along line 3B-3B of FIG. 3A.

FIG. 3A is a schematic cross-sectional view of an LED 226 disposed on a portion of a display panel 310, according to one embodiment. FIG. 3B is a sectional view of a portion of the LED 226 described in FIG. 3A, taken along line 3B-3B of FIG. 3A.

The LED 226 includes an active layer stack 304, a transparent conductive oxide (TCO) layer 306 disposed on the active layer stack 304, an electrically insulating layer 312, such as dielectric layer, disposed on the active layer stack 304, and an electrically conductive reflective layer 316, such as a metal layer, disposed on the electrically insulating layer 312. Typically, the active layer stack 304 of the LED 226 described herein is formed of one or more III-V materials, such as GaAs, GaN, InGaN, AlGaInP, or combinations thereof, and includes a p-type layer 304a, an n-type layer 304c, and one or more quantum well (QW) layers 304b interposed between the p-type layer 304a and the n-type layer 304c. In some embodiments, the blue and green LEDs 226 are formed using an active layer stack 304 that includes a InGaN layer interposed between a p-type GaN layer and n-type GaN layer, where the wavelength of light emitted by the active layer stack 304, and thus the color of light provided by the LED 226, is determined by relative concentrations of indium and gallium in the InGaN layer. Alternatively, dopants, or color filter layers, may be used to provide the different output colors of the LED 226. In some embodiments, red LED 226 are formed using an active layer stack 304 that includes an AlGaInP layer interposed between a p-type GaP layer and an n-type GaAs layer.

The LED 226 is mounted to a display panel 310 of a light field display 200 (shown in FIG. 2A), in a desired pixel arrangement 202 (shown in FIG. 2A), using a transparent conductive adhesive (TCA) layer 318 disposed therebetween. When mounted, a major surface of the active layer stack 304 is substantially parallel to a plane of the display panel 310. Typically, the active layer stack 304 has a thickness T(1) between about 10 nm and about 100 nm, such as about 30 nm and forms an ohmic contact with the TCO layer 306 at the surfaces therebetween. The TCO layer 306 is formed of a transparent conductive oxide material such as indium tin oxide (ITO) or doped conductive zinc-oxide, such as aluminum doped zinc oxide (AZO) or gallium doped zinc oxide (GZO). The TCO layer 306 and at least a portion of the active layer stack 304 form a circular or elliptical paraboloid shape, such as a substantially circular paraboloid shape at surfaces proximate to the electrically insulating layer 312.

The electrically insulating layer 312 is typically formed of a transparent dielectric material, such as silicon oxide, silicon nitride, or combinations thereof. The electrically insulating layer 312 is conformal to the circular paraboloid shape of surfaces of the TCO layer 306 and at least portions of the surfaces of the active layer stack 304 disposed therebeneath. In such a configuration, a reflective surface 316a of the reflective layer 316 disposed on the electrically insulating layer 312 forms an parabolic mirror, such as a circular or elliptical parabolic mirror, having a focal point F at or proximate to a surface of the p-type layer 304a. An opening 314 formed in the electrically insulating layer 312 enables a p-contact between the reflective layer 316, disposed through the opening 314, and the TCO layer 306. In some embodiments, the TCA layer 318 provides an n-type contact to the active layer stack 304. In other embodiments, the LED 226 is mounted to the display panel 310 using a transparent non-conductive adhesive.

In some embodiments, the LED 226 further includes a sapphire layer (not shown) disposed between the active layer stack 304 and the display panel 310, where the sapphire layer of the LED 226 is bonded to the display panel 310 using a non-electrically conductive transparent adhesive layer (not shown). In other embodiments, the LED 226 is mounted to a back panel (not shown).

Typically, a surface of the active layer stack 304 proximate to the TCO layer has a diameter D along the major axis thereof. In some embodiments, the diameter D is less than about 100 μm, such as less than about 50 μm, less than about 20 μm, less than about 10 μm, for example less than about 5 μm, or between about 0.1 μm and about 10 μm, such as between about 0.5 μm and about 10 μm, for example between about 0.5 μm and about 5 μm. In some embodiments, a ratio of the diameter D to a height of the LED 226, herein height H, is more than about 0.2, such as more than about 0.3, more than about 0.4, more than about 0.5, more than about 0.8, for example more than about 1.

In some embodiments, portions of the surface of the p-type layer 304a are selectively treated, for example plasma treated, to desirably form a non-or-low-light transmission region 304a(2) circumscribing a light transmission region 304a(1). Plasma treating the surface of the p-type layer in the non-or-low-light transmission region 304a(2) desirably increases the resistance of the ohmic contact with the TCO layer 306 disposed thereon to bound an area of effective light transmission from the active layer stack 304 to a light transmission region 304a(1) centered about the focal point F. Bounding the area of light transmission to a region about the focal point F desirably increases the collimation of light provided by the LED 226. The LED 226 generates collimated light rays 212 in a direction that is substantially orthogonal (Z-direction) to the display surface 210 (e.g., X-Y plane). Thus, the axis of symmetry Z' of the reflective surface 316a is in substantially the same direction as the Z-direction.

Figure 4:
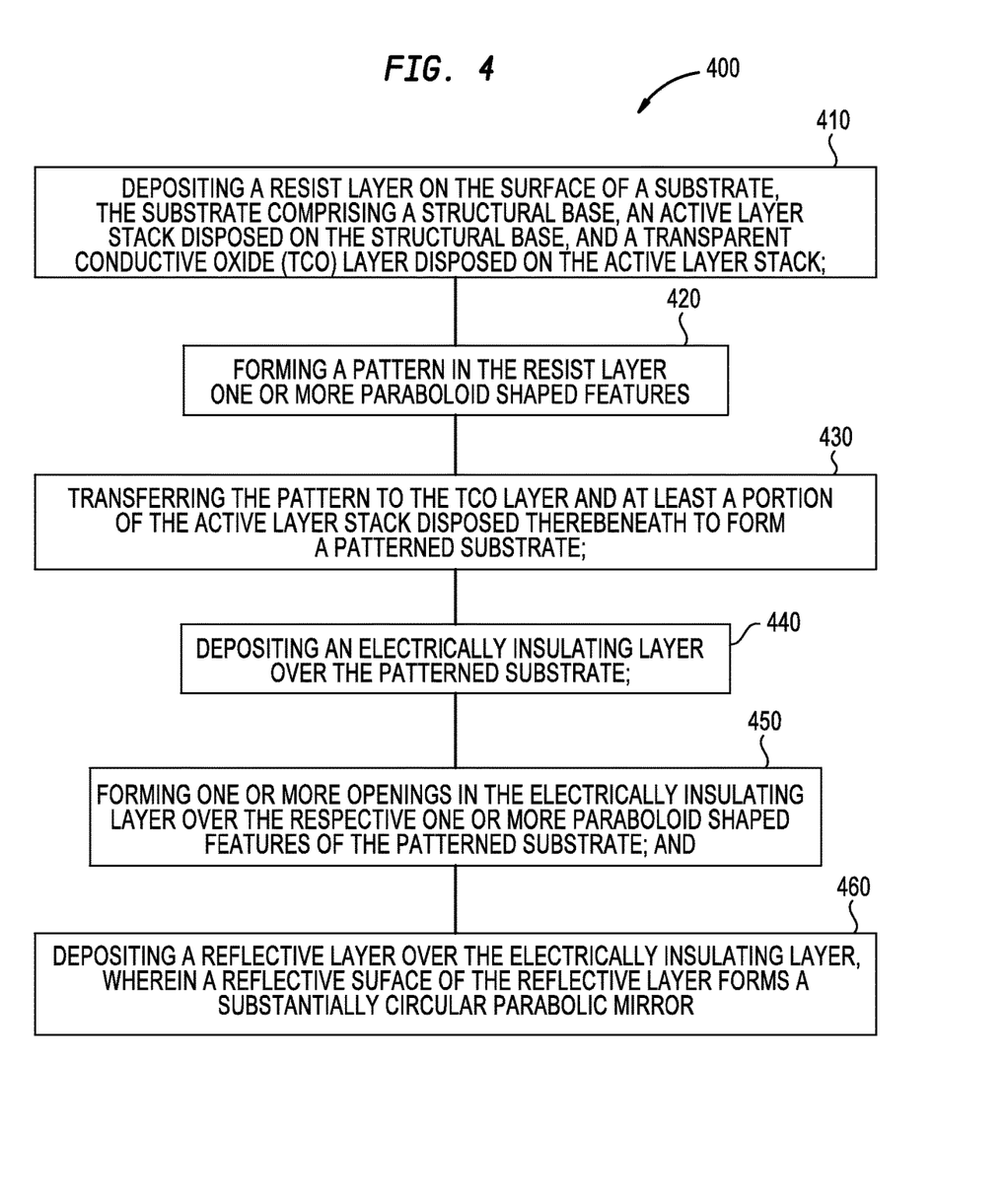
FIG. 4 is a flow diagram illustrating a method of forming an LED, according to one embodiment.

FIG. 4 is a flow diagram illustrating a method 400 of forming an LED 226, according to one embodiment. FIGS.

5A-5H schematically illustrate formation of an LED according to the method described in FIG. 4.

Figure 5A:
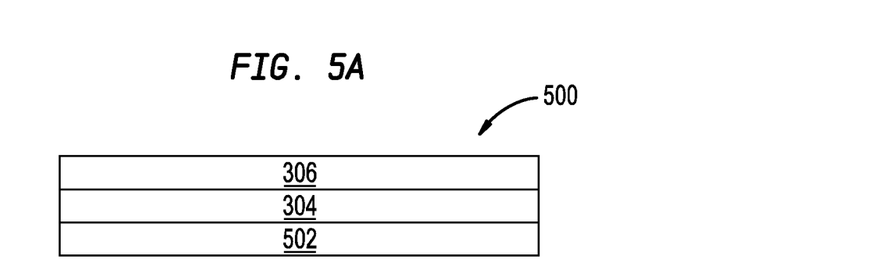
FIGS. 5A-5H schematically illustrate formation of an LED according to the method described in FIG. 4.
Figure 5B:
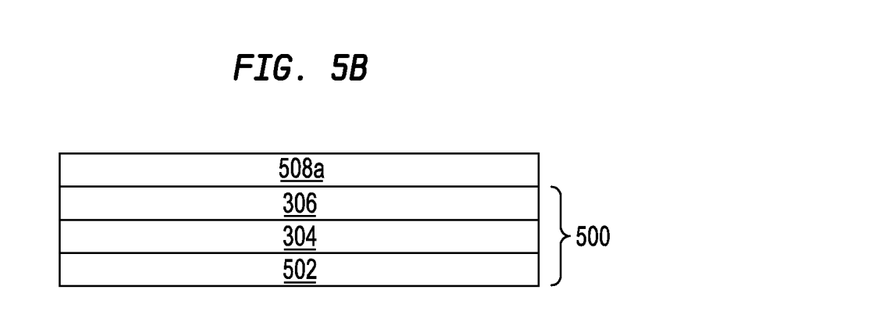
Figure 5C:
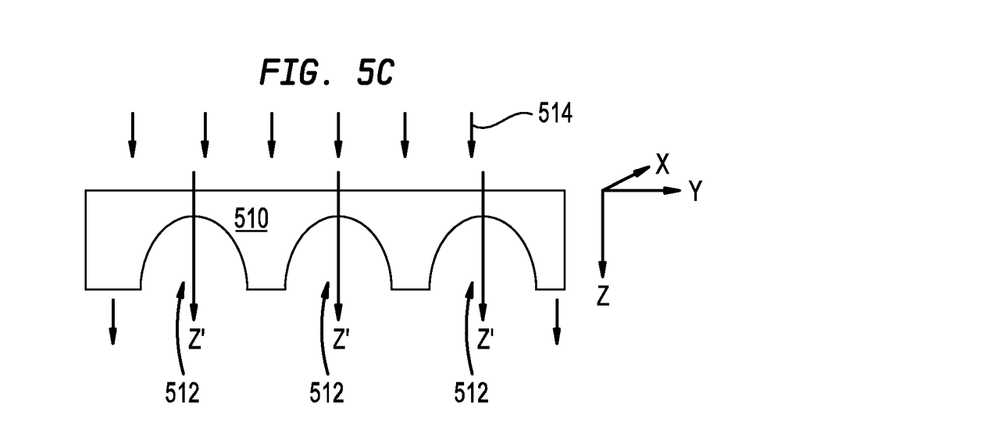
Figure 5D:
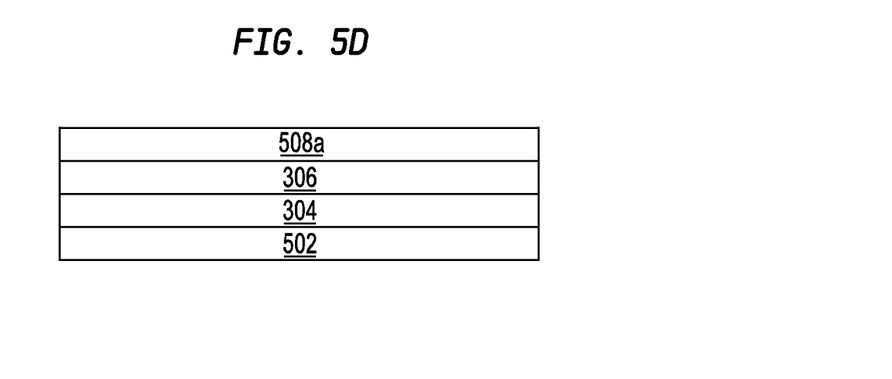
Figure 5E:
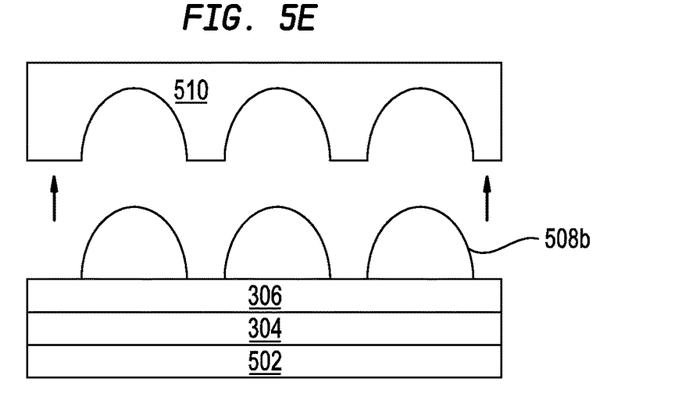

The method 400 includes depositing a resist layer, such as the resist layer 508 shown in FIG. 5B, on the surface of a substrate 500, at activity 410. The substrate 500 includes a structural base 502, an active layer stack 304 disposed on the structural base 502, and a transparent conductive oxide (TCO) layer 306 disposed on the active layer stack 304. Typically, the structural base 502 is formed of a lattice-matching material, such as sapphire or silicon carbide, and one or more layers of the active layer stack 304 are epitaxially formed thereon. The resist layer 508 herein comprises a UV curable resin material deposited and/or dispensed onto the surface of the substrate 500. In some embodiments, the resist layer 508 is formed from a plurality of droplets of the UV curable resin material.

At activity 420, the method 400 further includes physically imprinting a pattern into the resist layer 508 using an imprint lithography (IL) stamp 510. The imprint lithography (IL) stamp 510 includes one or more paraboloid shaped openings 512 formed therein. Physically pressing the IL stamp 510 into the resist layer 508 displaces the resin material about the pattern of the IL stamp. The resin material is cured using electromagnetic radiation provided through the IL stamp to form a patterned resist layer 508b comprising one or more paraboloid shaped features. An axis of symmetry Z' of the surface of the paraboloid shaped openings 512 is parallel to a Z-direction and orthogonal to the X-Y plane. Typically, the IL stamp 510 is formed of a material that is transparent to the electromagnetic radiation 514, such as UV radiation, used to cure the resin material of the resist layer 508. In other embodiments, the patterned resist layer 508b is formed using a thermal imprint lithography process or a grey-scale lithography process. In some other embodiments, the IL stamp 510 and/or the patterned resist layer 508b is formed using a grey-scale lithography process. In some other embodiments, the patterned resist layer 508b is formed using a combination of grey-scale lithography and imprint lithography. It is contemplated that other maskless direct lithography techniques may also be used.

Figure 5F:
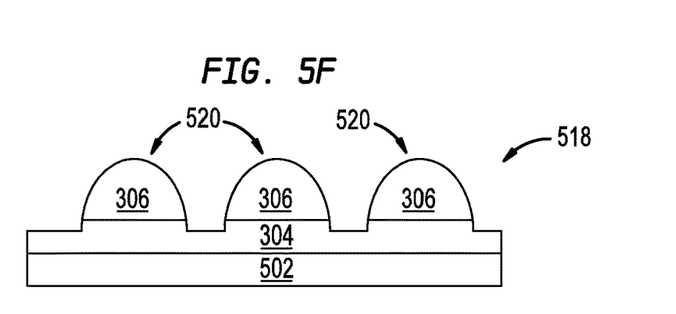
Figure 5G:
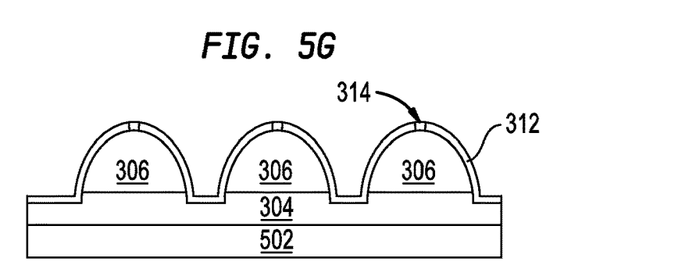

At activity 430, the method 400 further includes transferring the pattern formed in the patterned resist layer 508b to the TCO layer 306 and the active layer stack 304 disposed therebeneath to form a patterned substrate, such as the patterned substrate 518 of FIG. 5F. In FIG. 5F, the patterned substrate 518 includes one or more paraboloid shaped features 520 (three are shown). Typically, the pattern is transferred using a dry etch process, such as an inductively coupled plasma (ICP) etch process or a reactive ion etching (RIE) process.

At activities 440, 450, 460 the method 400 further includes depositing an electrically insulating layer 312 onto the patterned substrate 518, forming one or more openings 314 in the electrically insulating layer 312, and depositing a reflective layer 316 over the electrically insulating layer 312 to form one or more LEDs 226, such as the LED 226 described in FIG. 3.

Figure 5H:
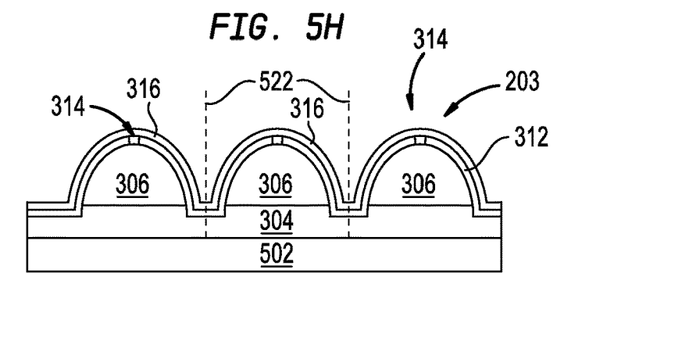

In some embodiments, the method 400 includes dicing the one or more LEDs 226 along the dicing lines 522 shown in FIG. 5H. Dicing the one or more LEDs 226 is typically done using laser scribing, mechanical sawing, water/solvent knifing, ion beam milling, a multi-layer photolithography etch process, or a combination thereof. The LEDs 226 may be diced into individual LEDs 226, or groups of LEDs 226 in a predetermined configuration, such as in a linear strip or the orientation shown in FIG. 2C. In some embodiments, the method 400 further includes removing all or a portion of the structural base 502 from the one or more LEDs 226 before and/or after the dicing. In some embodiments, the structural base 502 is removed from the one or more LEDs 226 using a conventional laser liftoff process, a chemical mechanical polishing (CMP) process, a wet-etch process, or a combination thereof.

After formation of the LEDs 226, the LEDs 226 are positioned in a predetermined array or configuration adjacent a micro-lens, such as micro-lens 224r, 224b, 224g. In one example, LEDs 226 may be arranged on and coupled to a display panel 310 (shown in FIG. 3A) in a pixel arrangement 202 (shown in FIG. 2A).

Figure 6A:
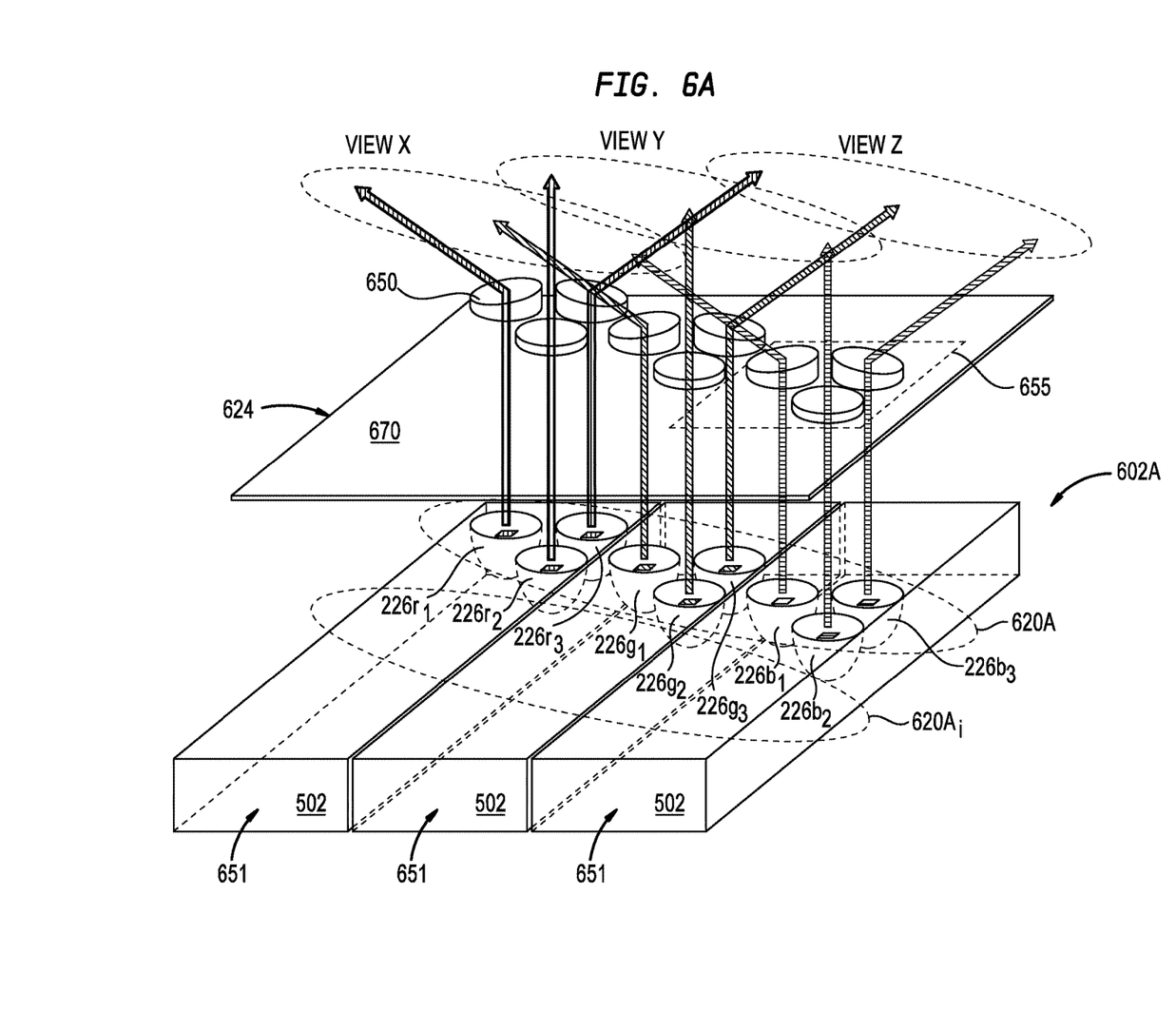
FIGS. 6A and 6B are schematic illustrations of pixel arrangements, according to other embodiments.
Figure 6B:
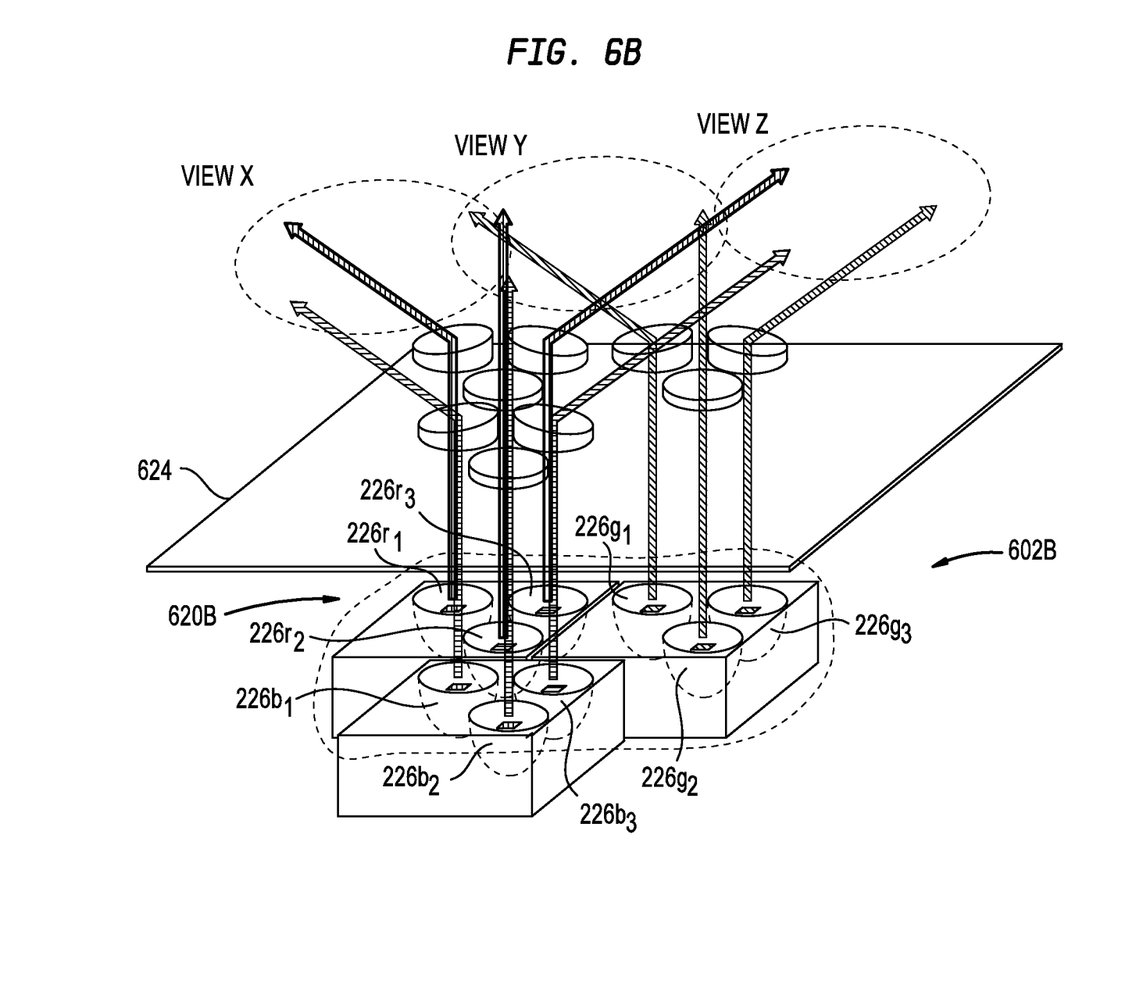

FIGS. 6A and 6B are schematic illustrations of pixel arrangements 602A, 602B, according to other embodiments. The pixel arrangements 602A, 602B may be used in place of pixel arrangement 202 in FIG. 2A.

The pixel arrangement 602A includes a plurality of pixels 620A (only one is shown for clarity). Each pixel 620A includes a plurality of red LEDs $226r_{(1, 2, 3)}$, a plurality of green LEDs $226g_{(1, 2, 3)}$, and a plurality of blue LEDs $226b_{(1, 2, 3)}$, which generate light that is subsequently directed by a micro-lens array 624. The micro-lens array 624 is a flat lens, such as a meta lens, that includes a plurality of light-directing features 650 thereon (nine are shown, with one light-directing feature 650 corresponding to a respective LED). The light directing-features 650 are positioned and configured to direct light from the red LEDs $226r_{(1, 2, 3)}$, the green LEDs $226g_{(1, 2, 3)}$, and the blue LEDs $226b_{(1, 2, 3)}$ in predetermined directions, with corresponding LEDs having light directed in a same angular direction. For example, LEDs $226r_1$, $226g_1$, and $226b_1$ are directed by the micro-lens array 624 in a same direction to generate a first angular resolution ("View X"). Similarly, corresponding LEDS $226r_2$, $226g_2$, and $226b_2$, as well as corresponding LEDS $226r_3$, $226g_3$, and $226b_3$ likewise are directed by the micro-lens array 624 to generate additional angular resolutions ("View Y" And View Z"). It is to be noted that additional LEDs $226r_i$, $226b_i$, $226g_i$ may be included in each pixel 620A, and additional light-directing features 650 may be included on the micro-lens array 624, to generate increased angular resolution (e.g., more "views"). The light directing features 650 may include or more of angled lenses, flat lenses, prisms, concave lenses, convex lenses, nano-fins such as titanium dioxide nano-fins, or other surface features configured to redirect light.

While only one pixel 620A is shown, the pixel arrangement 602A generally includes a plurality of pixels $620A_i$, arranged in array. To facilitate ease of manufacturing, LEDs $226r_i$, $226b_i$, $226g_i$ of same color are manufactured on a single substrate in a dense array and then diced into linear strips 651 (or other configurations) on structural bases 502. The linear strips 651 are then positioned in a desired configuration, for example, parallel and adjacent to one another, to form pixels for image generation. Similarly, light-directing features 650 are formed on the micro-lens array 624 in a fully-dense array, corresponding to a desired pixel arrangement and angular resolution. In such a configuration, the number, placement, and orientation of the light-directing features 650 may be tailored to determine light ray direction, the number of pixels (e.g., spatial resolution), and the number of angular views (e.g., angular resolution). For ease of manufacturing, the micro-lens array 624 includes an optically-transparent substrate panel 670, such as a glass sheet, upon which the light-directing features 650 are formed. Formation of the light-directing features 650 on the substrate panel 670 reduces manufacturing time of a light-field display, because the light-directing features 650 need not be individually aligned with a respective LED. Rather, proper positioning of the substrate panel 670 results in alignment of light-directing features 650 and all corresponding LEDS.

The example of FIG. 6A utilizes a single (unitary) micro-lens array 624 (covering all pixels 620A$_i$), the micro-lens array 624 having a plurality of light-directing features 650 thereon. Alternatively, a plurality of discrete micro-lens arrays, for example, indicated by box 655 (one is shown), may be used. In such an example, each discrete micro-lens array would include a plurality of light-directing features 650.

While FIG. 6A illustrates micro-lens array 624 as a flat lens, it is also contemplated that the micro-lens array 624 may include a plurality of convex or concave lenses positioned over each pixel 620A, as similarly shown with respect to FIG. 2B. In such an example, the plurality of convex or concave lenses may be formed on the substrate panel 670, or may be discrete units.

FIG. 6B illustrates a pixel arrangement 602B. The pixel arrangement 602B is similar to the pixel arrangement 602A, but rather than linear strips 651, the pixel arrangement 602b utilizes pixels 620B in clusters. In a specific example, the clusters have a triangular arrangement, as similarly shown and described with respect to FIG. 2C. Other cluster arrangements are contemplated. In addition to a densifying the arrangement of pixels per unit area, it is contemplated that the triangular arrangement may improve perceived resolution which may otherwise be reduced by the relatively large pixels, caused by the increased number of LEDs per pixel.

While embodiments of the disclosure are discussed with respect to LEDs, it is contemplated that organic LEDS (OLEDs) may be used in place thereof. Additionally, it is to be understood that the angular resolution of a pixel by be adjusted by varying the number of LEDs per micro-lens of each pixel. For example, each micro-lens of a pixel may include three or more corresponding LEDs, such as five or more, nine or more, 16 or more, 25 or more, 36 or more, and the like.

Benefits of the disclosed subject matter include increased resolution compared to conventional displays.

While the foregoing is directed to embodiments of the present disclosure, other and further embodiments of the disclosure may be devised without departing from the basic scope thereof, and the scope thereof is determined by the claims that follow.

What is claimed is:

1. A light field display, comprising:
a plurality of micro-lens groups, wherein
each micro-lens group comprises a plurality of micro-lenses,
each micro-lens has a corresponding micro-LED device array positioned therebeneath, the micro-LED device array comprising a plurality of micro-LED devices, and
each micro-LED device in the micro-LED device array comprises a reflective surface formed to collimate light emitted by an active stack of the micro-LED device and to direct the collimated light towards a micro-lens positioned thereabove.

2. The light field display of claim 1, wherein one or more micro-lenses of a micro-lens group has a concave shape which directs the collimated light from each of micro-LED devices in a respective plurality of directions, each of the directions corresponding to a pixel of angular resolution.

3. The light field display of claim 2, wherein the micro-lenses in a micro-lens group are arranged in a triangular configuration.

4. The light field display of claim 1, wherein the micro-lens group includes at least three micro-lenses, wherein the micro-LED devices of a micro-LED array emit the same color of light as each other, and wherein micro-LED device arrays respectively positioned beneath each of the three micro-lenses each collectively emit a different color light from each other.

5. The light field display of claim 4, wherein one or more of the micro-LED devices comprises:
an active layer stack;
a transparent conductive oxide (TCO) layer disposed on the active layer stack, wherein the transparent conductive oxide (TCO) layer and at least a portion of the active layer stack form a substantially circular paraboloid shape;
an electrically insulating layer disposed on the transparent conductive oxide (TCO) layer, the electrically insulating layer having an opening formed therein; and
a reflective layer disposed on the electrically insulating layer, wherein the reflective layer comprises the reflective surface, and wherein an axis of symmetry of the reflective surface is orthogonal to parallel surfaces of the active layer stack.

6. The light field display of claim 5, wherein the colors of light collectively emitted from each of the micro-LED arrays respectively positioned beneath each of at least three micro-lenses comprise red, green, and blue.

7. The light field display of claim 1, wherein the micro-LED devices of the micro-LED device arrays are arranged in a hexagonal pattern.

8. A light-field display, comprising:
a plurality of pixels of spatial resolution, each pixel of spatial resolution comprising:
a plurality micro-LED arrays, each micro-LED array comprising a monochromatic plurality of micro-LED devices; and
a plurality of micro-lens respectively positioned above each micro-LED array, wherein each of the micro-LED devices in a micro-LED array is configured to direct collimated light towards a corresponding micro-lens, and wherein the corresponding micro-lens changes the directions of the collimated light from a plurality of the micro-LED devices to provide a corresponding plurality of pixels of angular resolution.

9. The light-field display of claim 8, wherein a pixel of spatial resolution comprises a plurality of micro-LED arrays, wherein each micro-LED array has a corresponding micro-lens of a plurality of micro-lenses positioned thereover, and wherein colors of light provided by at least two of the micro-LED arrays are different from each other.

10. The light-field display of claim 8, wherein each of the micro-lenses of comprises a concave shape.

11. The light-field display of claim 10, wherein each pixel of spatial resolution comprises at least three concave lenses arranged in a triangular configuration.

12. The light-field display of claim 8, wherein each micro-LED array comprises at least three micro-LED devices.

13. The light-field display of claim 8, wherein the plurality of micro-LED devices of each micro-LED array are arranged in a hexagonal pattern.

14. A light-field display, comprising:
a plurality of pixels of spatial resolution, each pixel of spatial resolution comprising:
one or more light-directing features formed on a substrate panel; and
a corresponding micro-LED device positioned beneath each of the one or more light-directing features, the corresponding micro-LED device comprising an active stack and a reflective layer used to collimate light emitted by the active stack and to direct the collimated light towards the corresponding light directing feature.

15. The light-field display of claim 14, wherein micro-LED devices emitting the same color of light are arranged in linear strips or clusters.

16. The light-field display of claim 15, wherein the linear strips or clusters are positioned in closely-packed arrays.

17. The light-field display of claim 14, wherein the substrate panel spans the plurality of pixels of spatial resolution.

18. The light-field display of claim 14, wherein the reflective layer forms a substantially circular parabolic mirror.

19. The light field display of claim 18, wherein one or more of the micro-LED devices comprises:
the active layer stack;
a transparent conductive oxide (TCO) layer disposed on the active layer stack, wherein the transparent conductive oxide (TCO) layer and at least a portion of the active layer stack form a substantially circular paraboloid shape;
an electrically insulating layer disposed on the transparent conductive oxide (TCO) layer, the electrically insulating layer having an opening formed therein; and
the reflective layer disposed on the electrically insulating layer, wherein the reflective layer comprises a reflective surface, and wherein an axis of symmetry of the reflective surface is orthogonal to parallel surfaces of the active layer stack.

* * * * *